United States Patent [19]
Zweifel et al.

[11] Patent Number: 4,624,912
[45] Date of Patent: Nov. 25, 1986

[54] THERMALLY TRANSFERABLE LAYERS OF RADIATION SENSITIVE EPOXY RESINS USED TO PREPARE PROTECTIVE COATINGS AND RELIEF IMAGES

[75] Inventors: Hans Zweifel, Basel; Sigrid Bauer, Lutry; Kurt Meier, Allschwil, all of Switzerland

[73] Assignee: Ciba-Geigy Corporation, Ardsley, N.Y.

[21] Appl. No.: 698,952

[22] Filed: Feb. 6, 1985

[30] Foreign Application Priority Data

Feb. 10, 1984 [CH] Switzerland .......................... 631/84

[51] Int. Cl.[4] ...................... G03C 11/12; G03C 5/16; B44C 1/165
[52] U.S. Cl. .................................. 430/258; 430/260; 430/280; 430/327; 430/330; 430/325; 156/230; 156/240; 522/66; 522/31; 522/15
[58] Field of Search .............. 430/280, 258, 260, 256, 430/327, 330, 325; 204/159.14; 156/230, 240; 522/66, 31, 15

[56] References Cited

U.S. PATENT DOCUMENTS

| | | | |
|---|---|---|---|
| 3,526,504 | 9/1970 | Celeste | 430/281 X |
| 4,035,189 | 7/1977 | Hayashi et al. | 430/280 |
| 4,252,592 | 2/1981 | Green | 204/159.14 X |
| 4,299,938 | 11/1981 | Green et al. | 204/159.11 X |
| 4,383,025 | 5/1983 | Green et al. | 430/280 |
| 4,388,137 | 6/1983 | McCarty et al. | 156/230 X |
| 4,398,014 | 8/1983 | Green et al. | 204/159.21 X |
| 4,438,189 | 3/1984 | Geissler et al. | 430/281 X |
| 4,465,760 | 8/1984 | Leyrer et al. | 430/330 X |

FOREIGN PATENT DOCUMENTS

| | | |
|---|---|---|
| 94915 | 11/1983 | European Pat. Off. |
| 94914 | 11/1983 | European Pat. Off. |
| 2518639 | 11/1975 | Fed. Rep. of Germany |
| 56-155789 | 12/1981 | Japan .................................. 156/240 |
| 58-18288 | 2/1983 | Japan .................................. 156/230 |

OTHER PUBLICATIONS

E. Irving et al., Brit. Polym. J. 15, 24 (1983).
G. E. Green et al., J. Macromol. Sci., C21, 187 (1981).
Chem. Abst. 101, 15033r (1984).

*Primary Examiner*—John E. Kittle
*Assistant Examiner*—Cynthia Hamilton
*Attorney, Agent, or Firm*—Luther A. R. Hall

[57] ABSTRACT

A process for the production of a protective layer or a relief image on a substrate, wherein a radiation-sensitive layer, consisting of a solid film-forming epoxy resin containing a photoinitiator, which can be activated by radiation, for the polyaddition reaction, is transferred from a support to a substrate, then exposed directly or under a photomask and hardened by the action of heat, after which, if appropriate, the unexposed parts are developed with a solvent. The process is suitable, for example, for the production of printed circuits, solder resist masks and offset printing plates.

20 Claims, No Drawings

THERMALLY TRANSFERABLE LAYERS OF RADIATION SENSITIVE EPOXY RESINS USED TO PREPARE PROTECTIVE COATINGS AND RELIEF IMAGES

The present invention relates to a process for the application of protective layers or relief images to a substrate, wherein a radiation-sensitive layer consisting of a solid film-forming epoxy resin and of a photoinitiator which can be activated by radiation is transferred to the substrate, then exposed directly or under a photomask and then hardened by the action of heat, after which, if appropriate, the unexposed parts are developed with a solvent.

German Pat. No. 15 22 515 describes a process for the production of printed circuits, wherein a photosensitive layer is transferred from a support to a substrate and then the customary photographic process steps for the production of a relief image are carried out. This process has considerable technological advantages over the direct application of the photosensitive layer to a substrate, for example by means of a coating solution.

However, the photoresist laminates disclosed hitherto, consisting of support and photosensitive layer, have disadvantages attributable mainly to the use of liquid polyfunctional acrylate or methacrylate monomers as photocross-linkable compounds, if appropriate together with binders. The hardened protective layers or relief structures produced with the aid of these laminates do not meet the high thermal requirements which arise, for example, when printed circuit boards are subjected to further processing in soldering baths, and this disadvantage cannot be completely overcome by the addition of crosslinking agents (cf., for example, patent document No. EP-A-0,073,444). Moreover, the known laminates have the disadvantage that the photocross-linkable layer is oxygensensitive because of the monomers present in it, and can therefore be processed only by taking special protective measures. Thus, for example, exposure must be carried out through a transparent protective film covering the photosensitive layer, which, due to the light scattering which occurs, results in a reduction in the definition. The cold flow characteristic of thermoplastic resist layers furthermore causes the adhesive photosensitive layers to come out at the edges of the normally rolled-up laminates, rendering the material unusable.

It is also known that epoxy resins can be crosslinked with cationic photoinitiators and that these mixtures can be used for the photographic (=photomechanical) production of relief images, cf. E. Irving et al., Brit. Polym. J., 15, 24 et seq. (1983). There is no mention, however, of the fact that such mixtures can be used as thermally transferable radiation-sensitive layers.

It has now been found, surprisingly, that solid epoxy resins which contain a radiation-sensitive photoinitiator for the polyaddition reaction are outstandingly suitable as photosensitive layers which can easily be transferred from a support to a substrate and can be irradiated directly, without the use of a protective film (in the present case the carrier film) to cover them, optimum definitions being achieved. The laminate used in the process is also characterized by a high storage stability.

The present invention relates to a process for the production of a protective layer or a relief image on a substrate, wherein a radiation-sensitive layer is transferred from a support to the substrate, then exposed directly or under a photomask and then hardened by the action of heat, after which, if appropriate, the unexposed parts are developed with a solvent, and wherein the radiation-sensitive layer consists of a solid film-forming epoxy resin which contains a photoinitiator, which can be activated by radiation, for the polyaddition reaction.

The solid epoxy resin preferably has an epoxy equivalent weight of 1 to 5 equivalents per kg of resin.

The epoxy resins can be, for example, glycidyl ethers of novolaks of substituted or unsubstituted phenols, for example xylenol, cresol, resorcinol and particularly phenol, and aldehydes, for example acetaldehyde and particularly formaldehyde.

Another preferred group of epoxy resins are the glycidyl ethers of bisphenols. These can be monomers, oligomers or, preferably, low-molecular polymers with an average molecular weight $\overline{M}_w$ of about 1000 to 10,000. The molecular weight is preferably 1000 to 6000.

The bisphenols can be represented by the following formula:

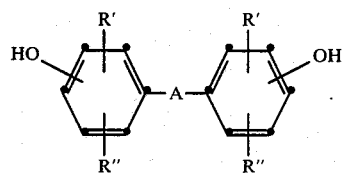

The hydroxyl groups can be in the m-position, but are particularly in the p-position. R' and R" in this formula can be alkyl having 1 to 6 C atoms, halogen such as chlorine or bromine, and in particular hydrogen atoms. A can be a direct bond or

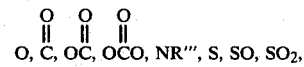

substituted or unsubstituted alkylidene, cycloalkylidene or alkylene. R''' is a hydrogen atom, phenyl or alkyl having 1 to 6 C atoms.

Examples of substituted or unsubstituted alkylidene are ethylidene, 1,1- or 2,2-propylidene, 2,2-butylidene, 1,1-isobutylidene, dichloroethylidene and trichloroethylidene. Examples of substituted or unsubstituted alkylene are methylene, ethylene, phenylmethylene, diphenylmethylene and methylphenylmethylene. Examples of cycloalkylidene are cyclopentylidene and cyclohexylidene.

Examples of bisphenols are: bis(p-hydroxyphenyl) ether or thioether, bis(p-hydroxyphenyl) sulfone, bis(p-hydroxyphenyl)methane, 1,2-bis(p-hydroxyphenyl)ethane, phenylbis(p-hydroxyphenyl)methane, diphenylbis(p-hydroxyphenyl)-methane, 2,2-bis(4'-hydroxy-3',5'-dimethylphenyl)propane, 1,1- or 2,2-bis(p-hydroxyphenyl)butane, 1,1-dichloro- or 1,1, 1-trichloro-2,2-bis(p-hydroxyphenyl)ethane, 1,1-bis(p-hydroxyphenyl)cyclopentane and particularly 2,2-bis(p-hydroxyphenyl)propane (bisphenol A) and 1,1-bis(p-hydroxyphenyl)cyclohexane (bisphenol C).

The epoxy resins also include solid prereacted resins obtainable by the reaction of polyepoxy compounds with suitable hardeners, for example aliphatic, cycloaliphatic or aromatic polyamines, polyols and polycarboxylic acids. Examples of polyepoxy compounds suitable for this purpose are aliphatic, cycloaliphatic or aromatic compounds. Examples of such compounds are the glycidyl ethers and β-methylglycidyl ethers of aliphatic or cycloaliphatic diols or polyols, for example those of ethylene glycol, propane-1,2-diol, propane-1,3-diol, butane-1,4-diol, diethylene glycol, polyethylene glycol, polypropylene glycol, glycerol, trimethylolpropane, 1,4-dimethylolcyclohexane, 2,2-bis(4-hydroxycyclohexyl)-propane and N,N-bis(2-hydroxyethyl)aniline; and the glycidyl ethers of diphenols and polyphenols, for example resorcinol, 4,4'-dihydroxydiphenylmethane, 4,4'-dihydroxydiphenyl-2,2-propane, novolaks and 1,1,2,2-tetrakis(4-hydroxyphenyl)-ethane. Additional examples are N-glycidyl compounds, for example the diglycidyl compounds of ethyleneurea, 1,3-propyleneurea, 5-dimethylhydantoin or 4,4'-methylene-5,5'-tetramethyldihydantoin, or those like triglycidyl isocyanurate.

Other glycidyl compounds of industrial importance are the glycidyl esters of carboxylic acids, in particular dicarboxylic and polycarboxylic acids. Examples of these are the glycidyl esters of succinic acid, adipic acid, azelaic acid, sebacic acid, phthalic acid, terephthalic acid, tetrahydrophthalic and hexahydrophthalic acids, isophthalic acid or trimellitic acid, or of fatty acid dimers.

Examples of polyepoxides other than glycidyl compounds are the diepoxides of vinylcyclohexene and dicyclopentadiene, 3-(3',4'-epoxycyclohexyl)-8,9-epoxy-2,4-dioxaspiro[5.5]undecane, the 3',4'-epoxycyclohexylmethyl ester of 3,4-epoxycyclohexanecarboxylic acid, butadiene diepoxide or isoprene diepoxide, epoxidized linoleic acid derivatives or epoxidized polybutadiene.

The said epoxides can also be prereacted on their own, by catalytic hardening, to give film-forming solid epoxy resins.

Other preferred epoxy resins are epoxy compounds which have been advanced beforehand, particularly diglycidyl ethers of dihydric phenols or dihydric aliphatic alcohols having 2 to 4 carbon atoms. The diglycidyl ethers, which have been lengthened beforehand, of 2,2-bis(4-hydroxyphenyl)propane and bis(4-hydroxyphenyl)methane are particularly preferred. Bisphenols, for example those of the type defined previously, particularly bisphenol A and tetrabromobisphenol A, are preferably used as "advancing" agents.

The solid film-forming epoxy resins to be used in the process according to the invention are known or purchasable or can be obtained by known processes. The radiation-sensitive layers produced with these epoxy resins are also preferably non-adhesive so that the photomask which may have been used during exposure can be removed from the layer undamaged and without leaving a residue.

A large number of different cationic compounds have been disclosed as photoinitiators which can be activated by radiation and which are suitable for the polyaddition reaction leading to the crosslinking of the epoxy resins, cf. Brit. Polymer J. 15, pages 24 et seq. (1983) and J. Macromol. Sci. Macromol. Rev. C21, pages 187 et seq. (1981).

Onium salts, particularly those with weakly nucleophilic anions, have proved particularly suitable. Examples of such anions are the halogen complex anions of divalent to heptavalent metals or non-metals, for example Sb, Sn, Fe, Bi, Al, Ga, In, Ti, Zr, Sc, V, Cr, Hf and Cu, as well as B, P and As. The halogen is preferably F. Examples are $BF_4^-$, $PF_6^-$, $AsF_6^-$ and $SbF_6^-$.

Examples of suitable onium salts are aryldiazonium salts and onium salts of groups Va, VIa and VIIa of the periodic table, for example halonium salts, particularly aromatic iodonium and iodoxonium salts, quaternary ammonium, phosphonium and arsonium salts, aromatic sulfonium salts and sulfoxonium salts or selenonium salts.

Preferred halonium salts are those of the formula II $$[R^3R^4X]_q^+[LQ_m]^{-q} \qquad (II)$$

wherein $R^3$ and $R^4$ independently of one another are a carbocyclic or heterocyclic aromatic radical having 6 to 20 C atoms, or $R^3$ and $R^4$ together are a divalent carbocyclic or heterocyclic aromatic radical, X is a halogen atom, m is a number corresponding to the sum of the values of L and q, L is a divalent to heptavalent metal or non-metal, Q is a halogen atom and q is a number from 1 to 3.

$R^3$ and $R^4$ can be substituted by one or more monovalent radicals, for example alkyl or alkoxy having 1 to 8 C atoms, halogen such as F, Cl or Br, nitro or cyano. Examples are phenyl, toluyl, xylyl, chlorophenyl, nitrophenyl, methoxyphenyl and pyridyl. $R^3$ and $R^4$ together can be, for example, 2,2'-biphenylene or 2,2'-bipyridyl. Preferred anions are those mentioned above. X is particularly iodine and q is particularly 1. Q is preferably Cl and particularly F. The iodonium salts are described, for example, in patent document No. DE-A-2,518,639. Diphenyliodonium hexafluorophosphate is particularly preferred.

Another preferred group consists of iodosyl salts of the formula IV $$[R^8R^9I^+=O]_{q[LQm]}^{-q} \qquad (IV)$$

wherein $R^7$ and $R^8$ are a carbocyclic or heterocyclic aromatic radical having 6 to 20 C atoms, m is a number corresponding to the sum of the values of L and q, L is a divalent to heptavalent metal or non-metal, Q is a halogen atom and q is a number from 1 to 3.

$R^8$ and $R^9$ are preferably phenyl or naphthyl which can be monosubstituted or polysubstituted, for example by $C_1$-$C_4$-alkyl or $C_1$-$C_4$-alkoxy, phenyl, nitro or halogen. Preferred anions are those mentioned above. Q is preferably Cl and particularly F and q is preferably 1. Diphenyliodosyl hexafluorophosphate or hexafluoroantimonate are examples of these salts. The iodosyl salts can be obtained, for example, by the reaction of diaryliodosyl hydroxide with an acid $H_q[LQ_m]^{q-}$ or ammonium salts thereof, in aqueous or aqueous-organic solutions, at temperatures from about 0° C. to 30° C.

Another preferred group consists of sulfonium salts of the formula III $$[R^5R^6R^7S]_q^+[LQ_m]^{-q} \qquad (III)$$

wherein $R^5$, $R^6$ and $R^7$ independently of one another are a carbocyclic or heterocyclic aromatic radical having 6 to 20 C atoms, or one of $R^5$, $R^6$ and $R^7$ is this aromatic radical and the other two together are a divalent carbocyclic or heterocyclic aromatic radical, m is a number corresponding to the sum of the values of L and q, L is a divalent to heptavalent metal or non-metal, Q is a halogen atom and q is a number from 1 to 3.

$R^5$, $R^6$ and $R^7$ are preferably carbocyclic aromatic radicals such as phenyl or naphthyl. These can be monosubstituted or polysubstituted, for example by $C_1$–$C_4$-alkyl, $C_1$–$C_4$-alkoxy, phenyl, nitro or halogen. Q is preferably Cl and particularly F and q is preferably 1. Examples are triphenylsulfonium hexafluorophosphate or hexafluoroantimonate.

Suitable sulfoxonium salts are described, for example, in U.S. Pat. Nos. 4,383,025, 4,398,014 and 4,299,938.

Other suitable photoinitiators are metal carbonyl compounds, metallocenes and metallocene carbonyl complexes.

A preferred group consists of salts of the formula I

$$[Y-Q^1-(CO)_b]^+ M^1 X_n^- \qquad (I)$$

wherein Y is an arene group or a dienylium group, $Q^1$ is an atom of a d-block transition metal selected from titanium, vanadium, chromium, manganese, iron, cobalt, nickel and copper; niobium, molybdenum, ruthenium, rhodium, palladium and silver; and tantalum, tungsten, rhenium, osmium, iridium, platinum and gold, b is a positive integer such that the atom $Q^1$ has a closed electron shell configuration, $M^1$ is an atom of a metal or non-metal, n is 4, 5 or 6 and is one greater than the valency of $M^1$, and X is a fluorine or chlorine atom, with the proviso that if $M^1$ is antimony, n is 6 and five of the symbols X are fluorine, one of them can also be a hydroxyl group.

If Y denotes an arene group, i.e. is itself a 6-electron ligand, it can be a mononuclear or polynuclear group, including a fused cyclic group. It is preferably a hydrocarbon group which is unsubstituted or substituted by one or more alkoxy groups and preferably contains 6 to 18 carbon atoms, such as benzene, toluene, mesitylene, naphthalene, biphenyl, phenanthrene, fluorene and anthracene.

If Y is a dienylium group, it is preferably a cyclic group of one of the following formulae

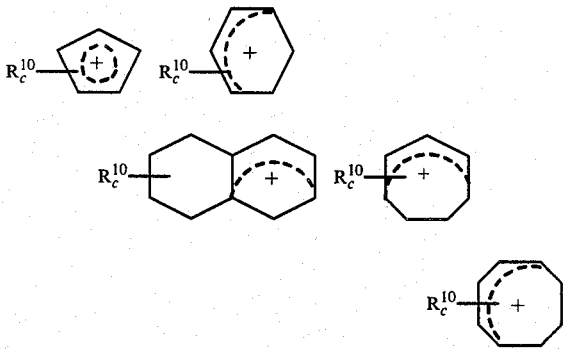

wherein $R^{10}$ is an alkyl group having 1 to 4 carbon atoms, an alkoxy group having 1 to 4 carbon atoms or an alkyl group having up to 12 carbon atoms, interrupted by one or more oxycarbonyl groups, and c is zero, 1, 2 or 3.

$Q^1$ is preferably chromium, cobalt, nickel and especially iron or manganese.

The atom $M^1$ can be, for example, iron, tin, bismuth, aluminium, gallium, indium, titanium, zirconium, scandium, vanadium, chromium or manganese, but is preferably antimony, arsenic, boron or phosphorus. The anion $M^1X_n^-$ can thus be, for example, tetrachloroaluminate or hexachloroferrate, but it is preferably tetrafluoroborate, hexafluoroarsenate, hydroxypentafluoroantimonate, hexafluoroantimonate or hexafluorophosphate.

Salts of these types are described, for example, in patent document No. EP-A-0,094,914.

A particularly preferred group of photoinitiators consists of those of the formula

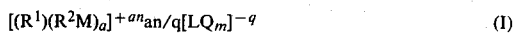

$$[(R^1)(R^2M)_a]^{+a n} \text{an}/q[LQ_m]^{-q} \qquad (I)$$

wherein a is 1 or 2 and n and q independently of one another are each an integer from 1 to 3, M is the cation of a monovalent to trivalent metal from group Ivb to VIIb, VIII or Ib of the periodic table, m is an integer corresponding to the sum of the values of L and q, Q is a halogen atom, L is a divalent to heptavalent metal or non-metal, $R^1$ is a $\pi$-arene and $R^2$ is a $\pi$-arene or the anion of a $\pi$-arene.

Suitable $\pi$-arenes $R^1$ and $R^2$ are, in particular, aromatic groups having 6 to 24 carbon atoms or heteroaromatic groups having 3 to 30 carbon atoms, it being possible for these groups to be unsubstituted or monosubstituted or polysubstituted by identical or different monovalent radicals such as halogen atoms, preferably chlorine or bromine atoms, or $C_1$–$C_8$-alkyl, $C_1$–$C_8$-alkoxy, cyano, $C_1$–$C_8$-alkylthio, $C_2$–$C_6$-monocarboxylic acid alkyl ester, phenyl, $C_2$–$C_5$-alkanoyl or benzoyl groups. These $\pi$-arene groups can be mononuclear, fused polynuclear or non-fused polynuclear systems, it being possible in the last-mentioned systems for the nuclei to be linked directly or via bridge members such as —S— or —O—.

As the anion of a $\pi$-arene, $R^2$ can be an anion of a $\pi$-arene of the abovementioned type, for example the indenyl anion and especially the cyclopentadienyl anion, it also being possible for these anions to be unsubstituted or monosubstituted or polysubstituted by identical or different monovalent radicals such as $C_1$–$C_8$-alkyl, $C_2$–$C_6$-monocarboxylic acid alkyl ester, cyano, $C_2$–$C_5$-alkanoyl or benzoyl groups.

The abovementioned alkyl, alkoxy, alkylthio, monocarboxylic acid alkyl ester and alkanoyl substituents can be straight-chain or branched. Typical alkyl, alkoxy, alkylthio, monocarboxylic acid alkyl ester and alkanoyl substituents are, respectively, methyl, ethyl, n-propyl, isopropyl, n-butyl, sec.-butyl, tert.-butyl, n-pentyl, n-hexyl and n-octyl, methoxy, ethoxy, n-propoxy, isopropoxy, n-butoxy, n-hexyloxy and n-octyloxy, methylthio, ethylthio, n-propylthio, isopropylthio, n-butylthio, n-pentylthio and n-hexylthio, carboxylic acid methyl, ethyl, n-propyl, isopropyl, n-butyl and n-pentyl esters, and acetyl, propionyl, butyryl and valeroyl. The abovementioned alkyl, alkoxy, alkylthio and monocarboxylic acid alkyl ester groups preferably have 1 to 4 and especially 1 or 2 carbon atoms in the alkyl moieties and the above-mentioned alkanoyl groups preferably have 2 or 3 carbon atoms. Preferred substituted $\pi$-arenes or anions of substituted $\pi$-arenes are those containing one or two of the abovementioned substituents, especially chlorine or bromine atoms, methyl, ethyl, methoxy, ethoxy, cyano or carboxylic acid methyl or ethyl ester groups and acetyl groups.

Identical or different $\pi$-arenes can be present as $R^1$ and $R^2$. Suitable heteroaromatic $\pi$-arenes are systems containing S, N and/or O atoms. Heteroaromatic $\pi$-arenes containing S and/or O atoms are preferred. Examples of suitable $\pi$-arenes are benzene, toluene, xylenes, ethylbenzene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, naphthalene, 1,2-dihydronaphthalene, 1,2,3,4-tetrahydronaphthalene, methylnaphthalenes, methoxynaphthalenes, ethoxynaphthalenes, chloronaphthalenes, bromonaphthalenes, biphenyl, indene, biphenylene, fluorene, phenanthrene, anthracene, 9,10-dihydroanthracene, triphenylene, pyrene, naphthacene, coronene, thiophene, chromene, xanthene, thioxanthene, benzothiophene, naphthothiophene, thianthrene, diphenyl ether, diphenyl sulfide, acridine and carbazole.

If a is 2, both the $R^2$ groups are preferably the anion of a $\pi$-arene and both the M atoms are atoms of the same metal. Examples of anions of substituted $\pi$-arenes are the anions of methylcyclopentadiene, ethylcyclopentadiene, n-propylcyclopentadiene and n-butylcyclopentadiene, and the anions of dimethylcyclopentadiene, of cyclopentadiene-carboxylic acid methyl and ethyl esters and of acetylcyclopentadiene, propionylcyclopentadiene, cyanocyclopentadiene and benzoylcyclopentadiene. Preferred anions are the anion of unsubstituted indene and especially of unsubstituted cyclopentadiene.

Preferably, a has the value 1, $R^1$ is benzene, toluene, xylene, methoxybenzene, chlorobenzene, p-chlorotoluene, naphthalene, methylnaphthalene, chloronaphthalene, methoxynaphthalene, biphenyl, indene, pyrene or diphenylene sulfide, and $R^2$ is the anion of cyclopentadiene, acetylcyclopentadiene or indene or is benzene, toluene, xylene, trimethylbenzene, naphthalene or methylnaphthalene.

Particularly preferred complexes of the formula I are those in which a is 1, $R^1$ is $\eta^6$-pyrene or $\eta^6$-naphthalene, $R^2$ is the anion of $\eta^5$-cyclopentadiene, n is preferably 1 or 2, especially 1, and q is preferably 1. M is, for example, $Ti^+$, $Ti^{2+}$, $Ti^{3+}$, $Zr^+$, $Zr^{2+}$, $Zr^{3+}$, $Hf^+$, $Hf^{2+}$, $Hf^{3+}$, $Nb^+$, $Nb^{3+}$, $Cr^+$, $Mo^+$, $Mo^{2+}$, $W^+$, $W^{2+}$, $Mn^+$, $Mn^{2+}$, $Re^+$, $Fe^{2+}$, $Co^{2+}$, $Co^{3+}$, $Ni^{2+}$ or $Cu^{2+}$. M is preferably a chromium, cobalt, manganese, tungsten or molybdenum cation, especially an iron cation and particularly preferably $Fe^{2+}$.

Examples of suitable metals or non-metals L are Sb, Fe, Sn, Bi, Al, Ga, In, Ti, Zr, Sc, V, Cr, Mn and Cu, lanthanides such as Ce, Pr and Nd, or actinides such as Th, Pa, U or Np. Suitable non-metals are especially B, P and As. L is preferably P, As, B or Sb, P being particularly preferred.

Examples of complex anions $[LQ_m]^{-q}$ are $BF_4^-$, $PF_6^-$, $AsF_6^-$ and $SbF_6^-$.

Examples of compounds of the formula II are ($\eta^6$-toluene) ($\eta^5$-indenyl)iron(II) hexafluorophosphate, ($\eta^6$-pyrene)($\eta^5$-cyclopentadienyl)iron(II) hexafluoroantimonate, ($\eta^6$-toluene)($\eta^5$-cyclopentadienyl)iron(II) hexafluorophosphate, $\eta^6$-naphthalene)($\eta^5$-cyclopentadienyl)iron(II) hexafluoroarsenate and ($\eta^6$-benzene)($\eta^5$-cyclopentadienyl)-cobalt(III) bis(tetrafluoroborate). Such metallocene salts are described, for example, in patent document No. EP-A-0,094,915.

The photoinitiators can be used in a quantity of 0.1-15% by weight, preferably 0.1-10% by weight and especially 0.5-5% by weight based on the epoxy resin.

The resist laminates used in the process according to the invention are prepared by customary processes, for example by initially dissolving the individual components in a suitable inert solvent.

Suitable organic solvents are polar solvents, particularly polar aprotic solvents, which can be used by themselves or in mixtures of at least two solvents. Examples of suitable solvents are: ethers such as diethyl ether, dibutyl ether, tetrahydrofuran, dioxane, methylethylene glycol, dimethylethylene glycol, dimethyldiethylene glycol, diethyldiethylene glycol, dibutyldiethylene glycol and dimethyltriethylene glycol, halogenohydrocarbons such as methylene chloride, chloroform, carbon tetrachloride, 1,2-dichloroethane, 1,1,2-trichloroethane and 1,1,2,2-tetrachloroethane, carboxylic acid esters and lactones, such as propylene carbonate, ethyl acetate, methyl propionate, ethyl benzoate, ethylglycol acetate, 2-methoxyethyl acetate, $\gamma$-butyrolactone, $\gamma$-valerolactone and mevalolactone, sulfoxides such as dimethyl sulfoxide and tetramethyl sulfoxide, sulfones such as dimethyl sulfone, diethyl sulfone, trimethylenesulfone and tetramethylenesulfone, ketones such as dimethyl ketone, methyl ethyl ketone, methyl isobutyl ketone and cyclohexanone, and substituted benzenes such as chlorobenzene and nitrobenzene.

Other customary additives can be incorporated at this stage, for example fillers, adhesion promoters and dyes, which do not have an adverse effect on the action of the initiators, and sensitizers. Examples of sensitizers are: perylene, 9,10-dichloroanthracene, 9,10-diphenylanthracene, 3,4-benzopyrene, 1-chloroanthracene, 2-methylanthracene, 9-methylanthracene, 2-t-butylanthracene, anthracene, 1,12-benzperylene, trans-1,3,5-hexatriene, 1,2-benzanthracene, pyrene, pentaphene, diphenyltetraacetylene, trans-stilbene, 1,2,3,4-dibenzanthracene, 1,2,5,6-dibenzanthracene, 1,3-cyclohexadiene, 1,2,7,8-dibenzanthracene, 1,2-benzopyrene, fluoroanthene, 1,2-benzochrysene, tetraacetylene glycol, diethyltetraacetylene, 1-aminonaphthalene, benzil, coronene, 1-nitronaphthalene, 3,4-benzofluorene, diphenyltriacetylene, 2,2'-binaphthyl, 1-naphthaldehyde, 5,6-benzochrysene, 1-acetylnaphthalene, 3,4,5,6-dibenzophenanthrene, cis-stilbene, 2,3-butanedione, chrysene, 1,2-benzofluorene, 2,3-benzofluorene, 1-benzoylnaphthalene, 1-naphthonitrile, naphthalene 1-carboxylic acid, diphenyldiacetylene, 1,2,6,7-dibenzopyrene, cyclopentadiene, 9-acetylphenanthrene, p-terphenyl, 1-naphthol, 1-iodonaphthalene, 2-phenylnaphthalene, 3,4-benzophenanthrene, 3-acetylphenanthrene, 1-bromonaphthalene, 1-chloronaphthalene, 2-naphthonitrile, acenaphthene, trans1,3-pentadiene, 2-naphthaldehyde, naphthalene-2-carboxylic acid, 2-acetylnaphthalene, 2-benzoylnaphthalene, 2,4-hexadien-1-ol, 1-methylnaphthalene, 1-methoxynaphthalene, 1,3-butadiene, 1-fluoronaphthalene, isoprene, 2-iodonaphthalene, 2-bromonaphthalene, 2-chloronaphthalene, 2-naphthol, 4-phenylbenzophenone, 4-phenylacetophenone, 2-methylnaphthalene, naphthalene, o-terphenyl, styrene, phenanthrene, 4,4'-bisdimethylaminobenzophenone, diphenylacetylene, anthraquinone, 4,4'-dichlorobiphenyl, triacetylene glycol, 4-hydroxybiphenyl, 2,4,6-octatriyne, m-terphenyl, 2-bromobiphenyl, thioxanthone, 2-isopropylthioxanthone, 2-chlorothioxanthone, 2-dodecylthioxanthone, 1-methoxycarbonylthioxanthone, 2-ethoxycarbonylthioxanthone, 3-(2-methoxyethoxycarbonyl)thioxanthone, 4-butoxycarbonylthioxanthone, 1-cyano-3-chlorothioxanthone, biphenyl, 3,4-methylenedioxyacetophenone, 4-cyanobenzophenone, triphenylene, 4-benzoylpyridine, 2-benzoylpyridine, fluorene, 4,4'-dichlorobenzophenone, 4-trifluoromethylbenzophenone, 3-methoxybenzophenone, 4-chlorobenzophenone, 3-chlorobenzophenone, 4,4'-dibromobenzophenone, 3-benzoylpyridine, 4-methoxybenzophenone, 3,4-dimethylbenzophenone, 4-methylenebenzophenone, benzophenone, 2-methylbenzophenone, 4,4'-dimethylbenzophenone, 2,5-dimethylbenzophenone, 2,4-dimethylbenzophenone, 4-cyanoacetophenone, 4-fluorobenzophenone, o-benzylbenzophenone, α-chloroacetophenone, diphenylene ether, carbazole, 4,4'-dimethoxybenzophenone, 4-acetylpyridine, 3,4,5-trimethylacetophenone, p-dicyanobenzene, 4-methoxybenzaldehyde, 4-methylbenzaldehyde, 3,5-dimethylacetophenone, 4-bromoacetophenone, 4-methoxyacetophenone, 3,4-dimethylacetophenone, benzaldehyde, triphenylmethylacetophenone, anthrone, 4-chloroacetophenone, 4-trifluoromethylacetophenone, phenylacetylene, 2,4,6-trimethylacetophenone, 3-methoxyacetophenone, 3-methylacetophenone, o-dicyanobenzene, 1-tetralone, 3-bromoacetophenone, 4-methylacetophenone, 3-cyanoacetophenone, 3-trifluoromethylacetophenone, hexachlorobenzene, xanthone, acetophenone, 2-phenylbutyrophenone, allylacetophenone, β-phenylpropiophenone, valerophenone, propiophenone, butyrophenone, 2-ethoxycarbonyl-3-nitrothioxanthone, 3-thiophenylphthalimide and N-methyl-4-thiophenylphthalimide.

Preference is given to thioxanthones, phthalimide thioethers and particularly anthracenes. These are preferably added in a quantity of 0.1–10% by weight, preferably 0.1–5% by weight, based on the epoxy resin.

The solution is applied to the support by means of conventional methods, for example by dipping, coating, spraying or centrifuging, with the aid of a feed hopper with a slot die, or by means of roll coating. The layer thicknesses are in the range from 10 to about 200 μm according to the intended use. After coating, the solvent is removed, for example by heating and, if appropriate, also in vacuo.

The support can be transparent or opaque and is preferably flexible. Preference is given to special papers and particularly plastic films, especially those made of polyethylene terephthalate, which can also be pigmented.

The layer present on the support can be protected by a covering film against dust and mechanical damage; polyolefin films or silicone-coated paper, for example, are suitable for this purpose. If the support and the covering film are impermeable to actinic radiation, the laminate can safely be handled in daylight. It may therefore be advantageous to tint the support and covering film accordingly.

The process according to the invention can be carried out, for example, according to the following details. The surface of the substrate is first cleaned. The substrate can be made of a variety of materials according to the intended use, for example plastics, metals, metal alloys, metalloids, semiconductors, glass, ceramic, $SiO_2$ or $Si_3N_4$.

The radiation-sensitive layer is then transferred from the support to the substrate, if appropriate after removal of the covering film, the transfer generally taking place under the application of pressure and heat. In this process, heating can be effected up to 150° C.

It is a particular advantage of the process according to the invention that the support can be removed after lamination, because the radiation-sensitive layer is nonadhesive, and the said layer can then be further modified by irradiation.

In the continuation of the process according to the invention, the layer, after irradiation, is hardened by the action of heat, preferably at temperatures of 50° to 150° C., particularly 80° to 130° C. In practice, only the already exposed parts are hardened by the action of heat in this step.

Irradiation and subsequent thermal hardening make it possible to produce particularly resistant protective layers on substrates. To produce photographic images, the irradiation is effected through a photomask and the image is then developed by treatment with a solvent.

The hardenable mixtures are advantageously irradiated with electron beams or actinic light, preferably having a wavelength of 200 to 600 nm and an intensity of 150 to 8000 Watts. Examples of suitable light sources are xenon lamps, argon lamps, tungsten lamps, carbon arcs, metal halide lamps, and metal arc lamps such as low-pressure, medium-pressure and high-pressure mercury discharge lamps. The irradiation is preferably carried out with metal halide lamps or high-pressure mercury discharge lamps. The irradiation time depends on a variety of factors, for example the thickness of the copying layer used, the type of light source and its distance from the composite irradiated. The irradiation time can preferably be, for example, 10–120 seconds.

For the thermal after-treatment, the exposed compositions can be heated in conventional convection ovens. If short heating or reaction times are required, the heating can be effected by exposure with, for example, IR radiation, IR lasers or microwave devices. The hardening time is in the range between approx. 1 and 10 minutes.

Developing is carried out with organic solvents in which the epoxy resins used are soluble. This process step can be mechanized and carried out, for example, with a spray developer or a continuous developer. Developing can also be carried out simply by wiping or by treatment with solvent vapour. Suitable solvents have already been mentioned above.

The surface revealed in the non-image areas can then be after-treated or modified according to the intended use. The surfaces can be, for example, etched, coated with metal by electroplating or electroless plating, implanted with ions, rendered hydrophilic, anodized, soldered or lacquered.

Principal fields of application for the process according to the invention are the manufacture of printed circuits, solder resist masks, high-pressure and low-pressure mouldings, nameplates, offset printing plates and templates.

Hardened epoxy resins are characterized by good thermomechanical, chemical and electrical properties, for example heat stability, good adhesion to substrates, high volume resistivity, and good resistance to electroplating, etching and soldering baths.

The process according to the invention makes it possible to combine these advantages, over direct coating with solutions, with a technologically less expensive and simple operation, the radiation-sensitive photoresist laminates used according to the invention additionally having the following advantages: reduced cold flow of the radiationsensitive layer and hence elimination of adhesion of the film edges; high photosensitivity; good storage stability and direct exposure of the layer, achieving a better definition. It has furthermore been found that a better covering of the edges of conductor tracks formed is also achieved by means of the lamination process.

The examples which follow illustrate the invention in greater detail:

EXAMPLES 1-4

A solution consisting of 10 g of an epoxy resin and 0.06 mmol of ($\eta^6$-1-methylnaphthalene)($\eta^5$-cyclopentadienyl)iron(II) hexafluorophosphate in 4 g of 1-acetoxy-2-ethoxyethane is applied to a polyester film (polyethylene terephthalate) with a 75μ wire doctor. After drying at 80° C., the resulting film (thickness: 150 μm) is applied to a copper-coated epoxy board at 130° C. with a roller laminator. Exposure is then carried out under a 21 step Stouffer sensitivity guide with a 500 W metal halide lamp at a distance of 50 cm, and this is followed by hardening. A 1:1 mixture of 1,1,1-trichloroethane and ethyl methyl ketone is used as the developer. The last step of which a complete image is formed is taken as a measure of the photosensitivity.

| Example | Epoxy resin | Epoxy value (Eq/kg) | Exposure time (seconds) | Hardening time (minutes) | Hardening temperature (°C.) | Developing time (seconds) | Step |
|---|---|---|---|---|---|---|---|
| 1 | epoxycresol novolak | 4.5 | 30 | 2 | 100 | 15 | 4 |
| | | | 30 | 2 | 120 | 15 | 5 |
| | | | 60 | 2 | 100 | 15 | 5 |
| | | | 120 | 5 | 120 | 30 | 10 |
| 2 | bisphenol A diglycidyl ether | 1.35 | 30 | 2 | 100 | 15 | 3 |
| | | | 30 | 2 | 120 | 15 | 3 |
| | | | 60 | 2 | 100 | 15 | 4 |
| | | | 120 | 5 | 120 | 30 | 7 |
| 3 | bisphenol A diglycidyl ether | 2.41 | 30 | 2 | 100 | 15 | 4 |
| | | | 60 | 2 | 100 | 100 | 6 |
| | | | 30 | 2 | 120 | 15 | 4 |
| | | | 120 | 5 | 120 | 30 | 8 |
| 4 | bisphenol A diglycidyl ether lengthened with tetrabromobisphenol A beforehand | | 30 | 2 | 110 | 30 | 4 |
| | | | 120 | 5 | 110 | 30 | 9 |
| | | | 120 | 5 | 100 | 30 | 10 |

EXAMPLES 5-8

10 g of an industrial epoxycresol novolak (epoxy content: 4.5 eq/kg) and 0.25 g of photoinitiator are dissolved in 4 g of 1-acetoxy-2-ethoxyethane and applied to a polyester film with a 75μ wire doctor. After drying at 80° C., the resulting film (thickness: ~50 μm) is laminated onto a copper-coated epoxy board at 130° C. Exposure is carried out under a 21 step Stouffer sensitivity guide with a 5000 W metal halide lamp (distance 50 cm), and this is followed by hardening. A 1:1 mixture of 1,1,1-trichloroethane and ethyl methyl ketone is used as the developer. The last step of which a complete image is formed is taken as a measure of the photosensitivity.

| Example | Initiator | Exposure time (seconds) | Hardening time (minutes) | Hardening temperature (°C.) | Developing time (seconds) | Step |
|---|---|---|---|---|---|---|
| 5 | ($\eta^6$-naphthalene)-($\eta^5$-cyclopentadienyl)-iron(II) hexafluoroantimonate | 30 | 2 | 110 | 1 | 11 |
| | | 5 | 2 | 110 | 1 | 7 |
| 6 | triphenylsulfonium hexafluorophosphate 2-methylanthracene* | 30 | 10 | 110 | 1 | 4 |
| | | 30 | 2 | 110 | 1 | 1 |
| 7 | diphenyliodonium hexafluoroantimonate 2-methylanthracene* | 30 | 10 | 110 | 1 | 15 |
| | | 30 | 2 | 110 | 1 | 15 |
| | | 5 | 2 | 110 | 1 | 9 |
| 8 | diphenyliodosyl hexafluorophosphate 2-methylanthracene* | 30 | 10 | 110 | 1 | 2 |

*2.5% by weight based on epoxycresol novolak

EXAMPLES 9-12

10 g of an industrial epoxycresol novolak (epoxy content: 4.5 eq/kg) and 0.06 mmol of ($\eta^6$-1-methyl-naphthalene) ($\eta^5$-cyclopentadienyl)iron(II) hexafluorophosphate are dissolved in 4 g of 1-acetoxy-2-ethoxyethane and applied to a polyester film with a 75μ wire doctor. The resulting film is dried at 80° C. and laminated onto various substrates at 130° C. with a roller laminator. Exposure is then carried out under a 21 step Stouffer sensitivity guide with a 5000 W metal halide lamp (distance ~50 cm), and this is followed by hardening at 110° C. A 1:1 mixture of 1,1,1-trichloroethane and ethyl methyl ketone is used as the developer. The last step of which a complete image is formed is taken as a measure of the photosensitivity.

| | | Exposure time and hardening time Exposure time (seconds) | | | |
|---|---|---|---|---|---|
| | | 30 Hardening time (minutes) | | 60 Hardening time (minutes) | |
| Example | Substrate | 2 | 10 | 2 | 10 |
| 9 | electrochemically roughened aluminium (from Rotaprint) | 4 | 11 | 7 | 13 |
| 10 | polyester film | 6 | 8 | 8 | 12 |

| Example | Substrate | Exposure time (seconds) | | | |
|---|---|---|---|---|---|
| | | 30 Hardening time (minutes) | | 60 Hardening time (minutes) | |
| | | 2 | 10 | 2 | 10 |
| 11 | (Mylar) paper impregnated with phenol/form-aldehyde resin (specification FR2) | 2 | 4 | 6 | 8 |
| 12 | Cu-coated epoxy laminate (Cu vetronite) | 2 | 6 | 8 | 9 |

EXAMPLE 13

10 g of an industrial epoxycresol novolak (epoxy content 4.5 eq/kg), 0.15 g of ($\eta^6$-1-methylnaphthalene)($\eta^5$-cyclopentadienyl)iron(II) hexafluorophosphate and 0.3 g of a dye of the formula

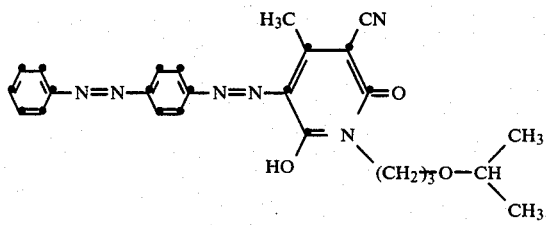

are dissolved in a mixture of 4 g of 1-acetoxy-2-ethoxyethane and 1 g of cyclohexanone and applied to a polyester film with a 75μ wire doctor. The resulting film is dried at 80° C. and then laminated onto a copper-coated epoxy board at 130° C. with a roller laminator. (Dry film thickness 30μ). Exposure is then carried out through a negative pattern of a printed circuit with a high-pressure mercury discharge lamp (5000 W, distance from the lamp 50 cm) and the exposed board is completely hardened for 5 minutes at 110° C. Developing of the exposed and hardened board is carried out in 1-acetoxy-2-ethoxyethane, the unexposed areas being dissolved away. This gives the image of the pattern. By etching in a 50% FeCl$_3$ solution, the blank copper parts are dissolved away, resulting in the conductive pattern of the desired circuit.

EXAMPLE 14

6 g of an industrial epoxycresol novolak (epoxy content 4.5 eq/kg), 4 g of allyl glycidyl ether, 0.15 g (3.68×10$^{-4}$ mol) of ($\eta^6$-1-methylnaphthalene)($\eta^5$-cyclopentadienyl)iron(II) hexafluorophosphate and 1.5 g of a chlorinated phthalocyanine dye (Colour Index No. 74260) are dissolved in a mixture of 4 g of 1-acetoxy-2-ethoxyethane and 1 g of cyclohexanone and applied to a polyester film with a 75μ wire doctor. The resulting film is dried at 80° C. (dry film thickness 30μ). The film is then laminated onto a copper-coated epoxy board by means of a roller laminator. This board is then exposed through a negative pattern of a solder resist mask with a high-pressure mercury discharge lamp (5000 W, distance from the lamp 50 cm). The exposed board is hardened at 110° C. for approx. 5 minutes and, after cooling, is developed in 1-acetoxy-2-ethoxyethane. This gives the image of the desired pattern, the lands being free. The board is then tinned in a soldering bath at 250° C., only the free copper areas being tinned. The hardened photoresist withstands this treatment even when the tinning cycle is repeated 10 times.

What is claimed is:

1. A process for the production of a protective layer on a substrate which comprises
   thermally transferring, by the application of pressure and heat at a temperature of up to 150° C., a radiation-sensitive layer from support to the substrate, which layer consists essentially of
   (a) a solid film-forming epoxy resin,
   (b) 0.1 to 15% by weight, based on the epoxy resin, of a cationic photoinitiator; and
   (c) 0 to 10% by weight, based on the epoxy resin, of a photo sensitizer,
   exposing directly said layer to radiation by an electron beam or actinic light, and then
   heating the layer after irradiation to harden said layer.

2. A process according to claim 1, wherein a dye is contained in the photosensitive layer.

3. A process according to claim 1, wherein the hardening temperature is in the range from 50° C. to 150° C.

4. A process according to claim 1, wherein the epoxy resin has an epoxy equivalent weight of 1 to 5 equivalents per kg of resin.

5. A process according to claim 1, wherein the photoinitiator corresponds to a compound of the formula I

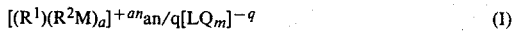

$$[(R^1)(R^2M)_a]^{+a_n}\text{an}/q[LQ_m]^{-q} \qquad (I)$$

wherein a is 1 or 2 and n and q independently of one another are each an integer from 1 to 3, M is the cation of a monovalent to trivalent metal from group Ivb to VIIb, VIII or Ib of the periodic table, m is an integer corresponding to the sum of the values of L and q, Q is a halogen atom, L is a divalent to heptavalent metal or non-metal, R$^1$ is a π-arene and R$^2$ is a arene or the anion of a π-arene.

6. A process according to claim 1, wherein the photoinitiator is a halonium salt of the formula II

$$[R^3R^4X]_q^+[LQ_m]^{-q} \qquad (II)$$

wherein R$^3$ and R$^4$ independently of one another are a carbocyclic or heterocyclic aromatic radical having 6 to 20 C atoms, or R$^3$ and R$^4$ together are a divalent carbocyclic or heterocyclic aromatic radical, X is a halogen atom, m is a number corresponding to the sum of the values of L and q, L is a divalent to heptavalent metal or non-metal, Q is a halogen atom and q is a number from 1 to 3.

7. A process according to claim 1, wherein the photoinitiator is a sulfonium salt of the formula III

$$[R^5R^6R^7S]_q^+[LQ_m]^{-q} \qquad (III)$$

wherein R$^5$, R$^6$ and R$^7$ independently of one another are a carbocyclic or heterocyclic aromatic radical having 6 to 20 C atoms, or one of R$^5$, R$^6$ and R$^7$ is this aromatic radical and the other two together are a divalent carbocyclic or heterocyclic aromatic radical, m is a number corresponding to the sum of the values of L and q, L is a divalent to heptavalent metal or non-metal, Q is a halogen atom and q is a number from 1 to 3.

8. A process according to claim 1, wherein the photoinitiator is an iodosyl salt of the formula IV

$$[R^8R^9I^+=O]_q[LQ_m]^{-q} \qquad (IV)$$

wherein R[7] and R[8] are a carbocyclic or heterocyclic aromatic radical having 6 to 20 C atoms, m is a number corresponding to the sum of the values of L and q, L is a divalent to heptavalent metal or non-metal, Q is a halogen atom and q is a number from 1 to 3.

9. A process according to claim 1, wherein a sensitizer is additionally contained in the photosensitive layer.

10. A process according to claim 1, wherein the epoxy resin is a diglycidyl ether, advanced with dihydric phenols, of aliphatic diols having 2 to 4 C atoms, or a bisphenol diglycidyl ether advanced with dihydric phenols, or wherein the epoxy resin is a glycidyl ether of a novolak or of a bisphenol.

11. A process for the production of a relief image on a substrate which comprises
thermally transferring, by the application of pressure and heat at a temperature of up to 150° C., a radiation-sensitive layer from a support to the substrate, which layer consists essentially of
(a) a solid film-forming epoxy resin,
(b) 0.1 to 15% by weight, based on the epoxy resin, of a cationic photoinitiator, and
(c) 0 to 10% by weight, based on the epoxy resin, of a photo sensitizer,
exposing said layer through a photomask to radiation by an electron beam or actinic light,
heating the layer after irradiation to harden the radiation-exposed parts of said layer, and then
developing the relief image with an organic solvent.

12. A process according to claim 11, wherein a dye is contained in the photosensitive layer.

13. A process according to claim 11, wherein the hardening temperature is the range from 50° C. to 150° C.

14. A process according to claim 11, wherein the epoxy resin has an epoxy equivalent weight of 1 to 5 equivalents per kg of resin.

15. A process according to claim 11, wherein the photoinitiator corresponding to a compound of the formula I $$[(R^1)(R^2M)_a]^{+an}{}_{n/q}[LQ_m]^{-q} \quad (I)$$

wherein a is 1 or 2 and n and q independently of one another are each an integer from 1 to 3, M is the cation of a monovalent to trivalent metal from group Ivb to VIIb, VIII or Ib of the periodic table, m is an integer corresponding to the sum of the values of L and q, Q is a halogen atom, L is a divalent to heptavalent metal or non-metal, $R^1$ is a π-arene and $R^2$ is a π-arene or the anion of a π-arene.

16. A process according to claim 11, wherein the photoinitiator is a halonium salt of the formula II $$[R^3R^4X]_q^+[LQ_m]^{-q} \quad (II)$$

wherein $R^3$ and $R^4$ independently of one another are a carbocyclic or heterocyclic aromatic radical having 6 to 20 C atoms, or $R^3$ and $R^4$ together are a divalent carbocyclic or heterocyclic aromatic radical, X is a halogen atom, m is a number corresponding to the sum of the values of L and q, L is a divalent to heptavalent metal or non-metal, Q is a halogen atom and q is a number from 1 to 3.

17. A process according to claim 11, wherein the photoinitiator is a sulfonium salt of the formula III $$[R^5R^6R^7S]_q^+[LQ_m]^{-q} \quad (III)$$

wherein $R^5$, $R^6$ and $R^7$ independently of one another are a carbocyclic or heterocyclic aromatic radical having 6 to 20 C atoms, or one of $R^5$, $R^6$ and $R^7$ is this aromatic radical and the other two together are a divalent carbocyclic or heterocyclic aromatic radical, m is a number corresponding to the sum of the values of L and Q, L is a divalent to heptavalent metal or non-metal, Q is a halogen atom and q is a number from 1 to 3.

18. The process according to claim 11, wherein the photoinitiator is an iodosyl salt of the formula IV $$[R^8R^9I^+=O]_q[LQ_m]^{-q} \quad (IV)$$

wherein R[7] and R[8] are a carbocyclic or heterocyclic aromatic radical having 6 to 20 C atoms, m is a number corresponding to the sum of the values of L and q, L is a divalent to heptavalent metal or non-metal, Q is a halogen atom and q is a number from 1 to 3.

19. A process according to claim 11, wherein a sensitizer is additionally contained in the photosensitive layer.

20. A process according to claim 11, wherein the epoxy resin is a diglycidyl ether, advanced with dihydric phenols, of aliphatic diols having 2 to 4 C atoms, or bisphenol diglycidyl ether advanced with dihydrid phenols, or wherein the epoxy resin is a glycidyl ether of a novolak or of a bisphenol.

* * * * *

UNITED STATES PATENT AND TRADEMARK OFFICE
CERTIFICATE OF CORRECTION

PATENT NO. : 4,624,912

DATED : NOVEMBER 25, 1986

INVENTOR(S) : HANS ZWEIFEL, SIGRID BAUER, KURT MEIER

It is certified that error appears in the above-identified patent and that said Letters Patent is hereby corrected as shown below:

Column 14, line 37 in Claim 5, line 10 cancel second occurrence of "arene" and insert -- $\pi$-arene-- so it reads "$R^2$ is a $\pi$-arene".

Column 14, line 67 in Claim 8, line 3 cancel the structure and insert therefor -- $[R^8 R^9 I^+ = 0]_q [LQ_m]^{-q}$ (IV) --.

Column 15, line 40 in Claim 15, line 2 cancel "corresponding" and insert -- corresponds --.

Column 16, line 27 in Claim 17, line 9 cancel "Q" and insert -- q --.

Column 16, line 46 in Claim 20, line 4 cancel "dihydrid" and insert -- dihydric --.

Signed and Sealed this

Fifteenth Day of September, 1987

Attest:

DONALD J. QUIGG

Attesting Officer    Commissioner of Patents and Trademarks